(12) United States Patent
Sugitani et al.

(10) Patent No.: US 11,381,206 B2
(45) Date of Patent: Jul. 5, 2022

(54) POWER AMPLIFIER AND FILTER

(71) Applicant: MITSUBISHI ELECTRIC CORPORATION, Tokyo (JP)

(72) Inventors: Takumi Sugitani, Tokyo (JP); Masatake Hangai, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 113 days.

(21) Appl. No.: 17/039,140

(22) Filed: Sep. 30, 2020

(65) Prior Publication Data

US 2021/0013849 A1 Jan. 14, 2021

Related U.S. Application Data

(63) Continuation of application No. PCT/JP2018/024414, filed on Jun. 27, 2018.

(51) Int. Cl.
*H03F 3/16* (2006.01)
*H03F 3/24* (2006.01)

(52) U.S. Cl.
CPC ....... *H03F 3/245* (2013.01); *H03F 2200/171* (2013.01); *H03F 2200/423* (2013.01)

(58) Field of Classification Search
CPC .......................................................... H03F 3/16
USPC .......................................... 330/277, 300, 303
See application file for complete search history.

(56) References Cited

U.S. PATENT DOCUMENTS

| | | | | |
|---|---|---|---|---|
| 5,969,575 A | * | 10/1999 | Helms | H03F 1/3205 330/306 |
| 8,558,622 B2 | * | 10/2013 | Uno | H03F 1/3205 330/302 |
| 2011/0068882 A1 | | 3/2011 | Honda et al. | |
| 2014/0225671 A1 | * | 8/2014 | Kamiyama | H03F 1/56 330/277 |

FOREIGN PATENT DOCUMENTS

| | | |
|---|---|---|
| JP | 8-139535 A | 5/1996 |
| JP | 2011-66822 A | 3/2011 |

* cited by examiner

*Primary Examiner* — Henry Choe
(74) *Attorney, Agent, or Firm* — Birch, Stewart, Kolasch & Birch, LLP

(57) ABSTRACT

A stub whose end is connected to an end of a transmission line, and a coupled line disposed in parallel with each of the transmission line and the stub, and electromagnetically coupled to each of the transmission line and the stub are included, and the stub and the coupled line operate as a first resonator for resonating with an odd order harmonic included in the amplified signal, and the transmission line, the stub, and the coupled line operate as a second resonator for resonating with an even order harmonic included in the amplified signal.

5 Claims, 3 Drawing Sheets

POWER AMPLIFIER AND FILTER

CROSS REFERENCE TO RELATED APPLICATIONS

This application is a Continuation of PCT International Application No. PCT/JP2018/024414, filed on Jun. 27, 2018, which is hereby expressly incorporated by reference into the present application.

TECHNICAL FIELD

The present disclosure relates to a power amplifier and a filter that resonate with each of odd order and even order harmonics.

BACKGROUND ART

In Patent Literature 1 below, a power amplifier including a second harmonic resonator for resonating with a second harmonic and a third harmonic resonator for resonating with a third harmonic is disclosed.

The power amplifier disclosed in Patent Literature 1 includes a transmission line for transmitting an amplified signal outputted from an amplifying element.

Further, the power amplifier currently disclosed in Patent Literature 1 includes the second harmonic resonator which is a coupled line disposed in parallel with a transmission line and electromagnetically coupled to the transmission line, and the third harmonic resonator which is a coupled line disposed in parallel with the transmission line and electromagnetically coupled to the transmission line.

The second harmonic resonator resonates with a second harmonic included in the amplified signal outputted from the amplifying element, thereby suppressing the second harmonic, and the third harmonic resonator resonates with a third harmonic included in the amplified signal outputted from the amplifying element, thereby suppressing the third harmonic.

CITATION LIST

Patent Literature

Patent Literature 1: JP-A-Hei 8-139535

SUMMARY OF INVENTION

Technical Problem

The power amplifier disclosed in Patent Literature 1 can suppress each of the second and third harmonics included in the amplified signal.

However, in the power amplifier disclosed in Patent Literature 1, it is necessary to arrange the coupled line that is the second harmonic resonator and the coupled line that is the third harmonic resonator in parallel with the transmission line, and the space in which the three lines are arranged in parallel must be ensured.

Therefore, a problem with the power amplifier disclosed in Patent Literature 1 is that in the case in which the space in which the three lines are arranged in parallel cannot be ensured, each of the second and third harmonics cannot be suppressed.

The present disclosure is made in order to solve the above-mentioned problem, and it is therefore an object of the present disclosure to provide a power amplifier and a filter capable of suppressing each of odd order and even order harmonics as long as space in which two lines are arranged in parallel can be ensured.

Solution to Problem

A power amplifier according to the present disclosure includes: an amplifying element to amplify a signal to be amplified, and outputting the amplified signal; a transmission line whose end is connected to an output terminal of the amplifying element, to transmit the amplified signal outputted from the output terminal of the amplifying element; a stub whose end is connected to the end of the transmission line; and a coupled line disposed in parallel with each of the transmission line and the stub, and electromagnetically coupled to each of the transmission line and the stub, and the stub and the coupled line operate as a first resonator to resonate with an odd order harmonic included in the amplified signal, and the transmission line, the stub, and the coupled line operate as a second resonator to resonate with an even order harmonic included in the amplified signal.

Advantageous Effects of Invention

According to the present disclosure, the power amplifier is configured in such a way that the power amplifier includes the stub whose end is connected to the end of the transmission line, and the coupled line disposed in parallel with each of the transmission line and the stub, and electromagnetically coupled to each of the transmission line and the stub, and the stub and the coupled line operate as the first resonator for resonating with an odd order harmonic included in the amplified signal, and the transmission line, the stub, and the coupled line operate as the second resonator for resonating with an even order harmonic included in the amplified signal. Therefore, the power amplifier according to the present disclosure can suppress each of the odd order and even order harmonics as long as space in which the two lines are arranged in parallel can be ensured.

DESCRIPTION OF EMBODIMENTS

Hereafter, in order to explain the present disclosure in greater detail, embodiments of the present disclosure will be described with reference to the accompanying drawings.

Embodiment 1

Figure 1:
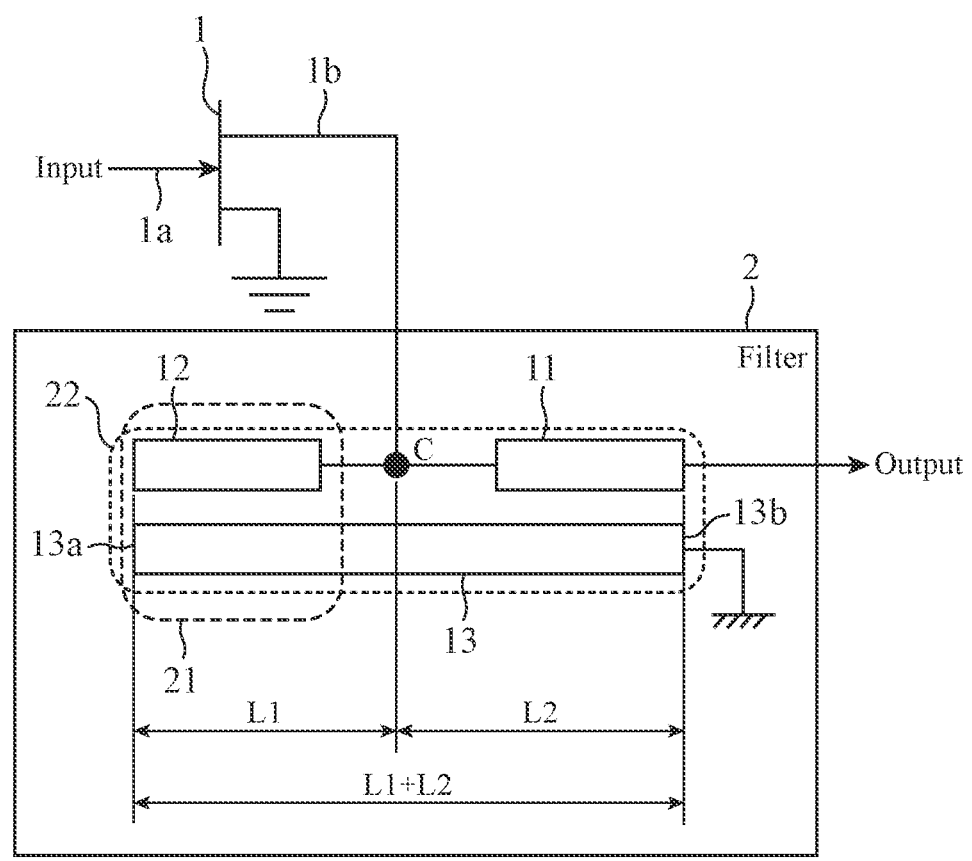
FIG. 1 is a schematic diagram showing a power amplifier according to Embodiment 1.

FIG. 1 is a schematic diagram showing a power amplifier according to Embodiment 1.

In FIG. 1, an amplifying element 1 amplifies a high frequency signal (signal to be amplified) inputted from an input terminal 1$a$, and outputs the amplified high frequency signal to a filter 2 from an output terminal 1$b$.

As for the amplifying element 1, a field effect transistor (FET), a heterojunction bipolar transistor (HBT), or the like can be used.

In the power amplifier shown in FIG. 1, a source terminal or an emitter terminal of the amplifying element 1 is grounded. However, this is only an example, and a transistor in which a drain terminal or a collector terminal of the amplifying element 1 is grounded may be provided.

The filter 2 includes a transmission line 11, a stub 12, and a coupled line 13.

Each of the transmission line 11, the stub 12, and the coupled line 13 is formed in a semiconductor board by using, for example, a metal pattern.

A serial line including the transmission line 11 and the stub 12 is assumed to be a single line. Therefore, the filter 2 has a configuration in which the two lines: the serial line including the transmission line 11 and the stub 12, and the coupled line 13 are arranged in parallel.

The filter 2 suppresses each of second and third harmonics included in the amplified high frequency signal outputted from the output terminal 1b of the amplifying element 1, and outputs a fundamental wave included in the high frequency signal.

The transmission line 11 has an end connected to the output terminal 1b of the amplifying element 1, and transmits the amplified high frequency signal outputted from the output terminal 1b of the amplifying element 1.

The stub 12 is an open stub whose end is connected to the end of the transmission line 11.

The stub 12 has an electric length L1 ($=\lambda_f/12$) which is one twelfth of the wavelength $\lambda_f$ of the fundamental wave f included in the amplified high frequency signal outputted from the output terminal 1b of the amplifying element 1.

Although in the power amplifier shown in FIG. 1 the transmission line 11 and the stub 12 are illustrated as if the transmission line and the stub are separate from each other, the transmission line 11 and the stub 12 are connected actually at a connection point C.

In the coupled line 13, an end 13a on a side of the stub 12 is open and an end 13b on a side of the transmission line 11 is grounded.

The coupled line 13 is disposed in parallel with each of the transmission line 11 and the stub 12, and is electromagnetically coupled to each of the transmission line 11 and the stub 12.

The coupled line 13 has an electric length (L1+L2) ($=\lambda_f/8$) which is one eighth of the wavelength $\lambda_f$ of the fundamental wave f included in the amplified high frequency signal outputted from the output terminal 1b of the amplifying element 1.

The electric length L2 is the one which the transmission line 11 has, and is $\lambda_f/24$ which is one twenty-fourth of the wavelength $\lambda_f$ of the fundamental wave f.

The stub 12 and the coupled line 13 operate as a first resonator 21 for resonating with the third harmonic (odd order harmonic) included in the amplified high frequency signal.

The transmission line 11, the stub 12, and the coupled line 13 operate as a second resonator 22 for resonating with the second harmonic (even order harmonic) included in the amplified high frequency signal.

Next, the operation of the power amplifier shown in FIG. 1 will be explained.

When a high frequency signal is inputted from the input terminal 1a, the amplifying element 1 amplifies the high frequency signal and outputs the amplified high frequency signal to the filter 2 from the output terminal 1b.

The stub 12 is connected to the end of the transmission line 11, and the electric length L1 of the stub 12 is $\lambda_f/12$ which is one twelfth of the wavelength $\lambda_f$ of the fundamental wave f included in the amplified high frequency signal outputted from the output terminal 1b of the amplifying element 1. Further, the electric length L1 of the stub 12 is $\lambda_{3f}/4$ which is a quarter of the wavelength $\lambda_{3f}$ of the third harmonic included in the amplified high frequency signal.

Therefore, because the stub 12 and the coupled line 13 operate as the first resonator 21 for resonating with the third harmonic included in the high frequency signal, the third harmonic is suppressed by the first resonator 21.

The coupled line 13 is disposed in parallel with each of the transmission line 11 and the stub 12, and is electromagnetically coupled to each of the transmission line 11 and the stub 12.

The electric length (L1+L2) of the coupled line 13 is $\lambda_f/8$ which is one eighth of the wavelength $\lambda_f$ of the fundamental wave f included in the amplified high frequency signal outputted from the output terminal 1b of the amplifying element 1. Further, the electric length (L1+L2) of the coupled line 13 is $\lambda_{2f}/4$ which is a quarter of the wavelength $\lambda_{2f}$ of the second harmonic included in the amplified high frequency signal.

Therefore, because the transmission line 11, the stub 12, and the coupled line 13 operate as the second resonator 22 for resonating with the second harmonic included in the high frequency signal, the second harmonic is suppressed by the second resonator 22.

The fundamental wave f included in the amplified high frequency signal outputted from the output terminal 1b of the amplifying element 1 is transmitted through the transmission line 11 and is outputted to the outside.

Here, FIG. 2 is an explanatory drawing showing a simulation result when each of second and third harmonic processes is performed by the filter 2.

Figure 2B:
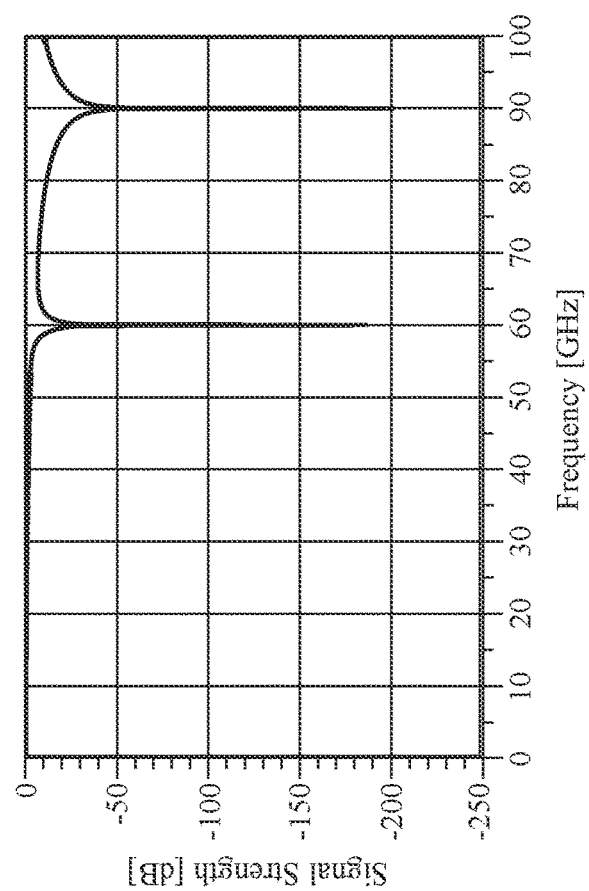
FIG. 2B is a graph showing a relation between frequency and signal strength as a simulation result.
Figure 2A:
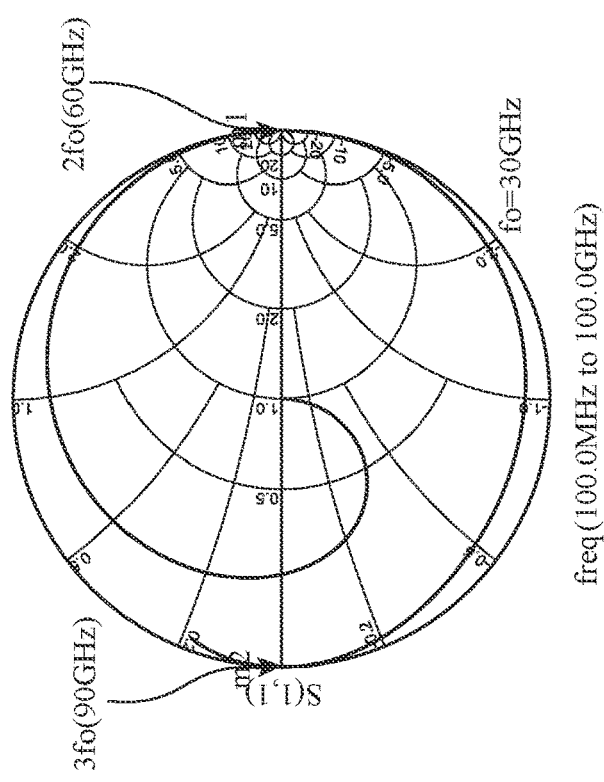
FIG. 2A is a Smith chart showing a simulation result.

FIG. 2A is a Smith chart showing the simulation result, and FIG. 2B is a graph showing a relation between frequency and signal strength as the simulation result.

The simulation result shown in FIG. 2 show a result in which the filter 2 processes the second harmonic included in a high frequency signal in a 30 GHz band, and a result in which the filter 2 processes the third harmonic included in the high frequency signal.

FIG. 2A shows that 60 GHz which is the frequency of the second harmonic is open, and 90 GHz which is the frequency of the third harmonic is short-circuited.

FIG. 2B shows that the signal strength of each of the second and third harmonics included in the high frequency signal is attenuated.

In above-mentioned Embodiment 1, the power amplifier is configured in such a way that the power amplifier includes the stub 12 whose end is connected to an end of the transmission line 11, and the coupled line 13 disposed in parallel with each of the transmission line 11 and the stub 12, and electromagnetically coupled to each of the transmission line 11 and the stub 12, and the stub 12 and the coupled line 13 operate as the first resonator 21 for resonating with an odd order harmonic included in the amplified signal, and the transmission line 11, the stub 12, and the coupled line 13 operate as the second resonator 22 for resonating with an even order harmonic included in the amplified signal. Therefore, the power amplifier can suppress each of the odd order and even order harmonics as long as space in which the two lines are arranged in parallel can be ensured.

In the power amplifier shown in FIG. 1, the first resonator 21 resonates with the third harmonic, and the second resonator resonates with the second harmonic. However, this is only an example, and the first resonator 21 may be made to resonate with an odd order harmonic, such as a fifth harmonic or a seventh harmonic, and the second resonator may be made to resonate with an even order harmonic, such as a fourth harmonic or a sixth harmonic.

In order that the first resonator 21 resonates with, for example, the fifth harmonic, the electric length L1 of the stub 12 should just be $\lambda_f/20$ which is one twentieth of the wavelength $\lambda_f$ of the fundamental wave f included in the amplified high frequency signal outputted from the output terminal 1b of the amplifying element 1.

In order that the second resonator 22 resonates with, for example, the fourth harmonic, the electric length (L1+L2) of the coupled line 13 should just be $\lambda_f/16$ which is one sixteenth of the wavelength $\lambda_f$ of the fundamental wave f included in the amplified high frequency signal outputted from the output terminal 1b of the amplifying element 1.

Embodiment 2

In the power amplifier shown in FIG. 1, the transmission line 11, the stub 12, and the coupled line 13 are formed in an identical plane of the semiconductor board.

In Embodiment 2, a power amplifier will be explained in which a coupled line 13 is formed on a layer of a semiconductor board (circuit board), the layer being different from a layer of the semiconductor board on which each of a transmission line 11 and a stub 12 is formed.

Figure 3:
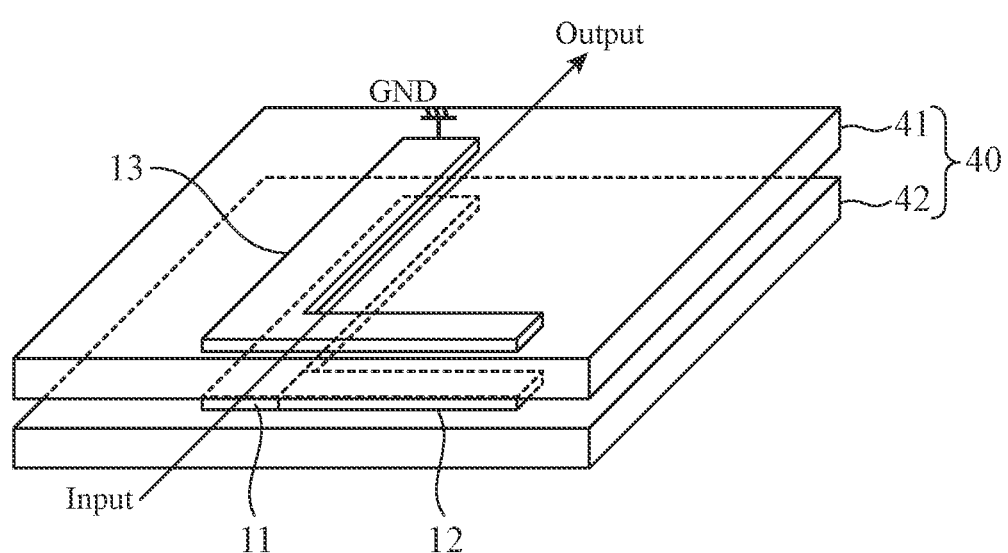
FIG. 3 is a perspective view showing a power amplifier according to Embodiment 2.

FIG. 3 is a perspective view showing the power amplifier according to Embodiment 2. In FIG. 3, because the same reference signs as those shown in FIG. 1 denote the same components or like components, explanation of the components will be omitted hereafter.

In FIG. 3, the illustration of the amplifying element 1 is omitted.

The semiconductor board 40 is a multilayer board including a first layer 41 and a second layer 42.

The coupled line 13 is formed on the first layer 41. In the power amplifier shown in FIG. 3, the coupled line 13 has an L-character shape.

Each of the transmission line 11 and the stub 12 is formed on the second layer 42. In the power amplifier shown in FIG. 3, the transmission line 11 and the stub 12 are connected in the shape of L depending on the shape of the coupled line 13.

When the second layer 42 is viewed from the first layer 41, the coupled line 13, and the transmission line 11 and the stub 12 are arranged in such a manner that the coupled line 13 overlaps the transmission line 11 and the stub 12.

In above-mentioned Embodiment 2, the power amplifier is configured in such a way that the coupled line 13 is formed on a layer of the circuit board, the layer being different from a layer of the circuit board on which each of the transmission line 11 and the stub 12 is formed. Therefore, the power amplifier of Embodiment 2 can reduce the occupation area of the filter 2 in one plane in the circuit board as compared with the power amplifier of Embodiment 1.

It is to be understood that any combination of the above-mentioned embodiments can be made, various changes can be made in any component according to any one of the above-mentioned embodiments, or any component according to any one of the above-mentioned embodiments can be omitted within the scope of the present disclosure.

INDUSTRIAL APPLICABILITY

The present disclosure is suitable for a power amplifier and a filter that resonate with each of odd order and even order harmonics.

REFERENCE SIGNS LIST 1 amplifying element, 1a input terminal, 1b output terminal, 2 filter, 11 transmission line, 12 stub, 13 coupled line, 13a, 13b end, 21 first resonator, 22 second resonator, 40 semiconductor board, 41 first layer, and 42 second layer.

The invention claimed is:

1. A power amplifier comprising:
an amplifying element to amplify a signal to be amplified, and outputting the amplified signal;
a transmission line whose end is connected to an output terminal of the amplifying element, to transmit the amplified signal outputted from the output terminal of the amplifying element;
a stub whose end is connected to the end of the transmission line; and
a coupled line disposed in parallel with each of the transmission line and the stub, and electromagnetically coupled to each of the transmission line and the stub,
wherein the stub and the coupled line operate as a first resonator to resonate with an odd order harmonic included in the amplified signal, and the transmission line, the stub, and the coupled line operate as a second resonator to resonate with an even order harmonic included in the amplified signal.

2. The power amplifier according to claim 1, wherein the stub has an electric length which is one twelfth of a wavelength of a fundamental wave included in the amplified signal, and the stub and the coupled line operate as the first resonator to resonate with a third harmonic included in the amplified signal.

3. The power amplifier according to claim 1, wherein the coupled line has an electric length which is one eighth of a wavelength of a fundamental wave included in the amplified signal, and the transmission line, the stub, and the coupled line operate as the second resonator to resonate with a second harmonic included in the amplified signal.

4. The power amplifier according to claim 1, wherein the stub is an open stub, and in the coupled line, an end on a side of the stub is open and an end on a side of the transmission line is grounded.

5. The power amplifier according to claim 1, wherein the coupled line is formed on a layer of a circuit board, the layer being different from a layer of the circuit board on which each of the transmission line and the stub is formed.

* * * * *